(12) United States Patent
Huang

(10) Patent No.: US 10,326,222 B2
(45) Date of Patent: Jun. 18, 2019

(54) DISPLAY DEVICES

(71) Applicant: Shenzhen China Star Optoelectronics Technology Co., Ltd., Shenzhen, Guangdong (CN)

(72) Inventor: Xiaoyu Huang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 139 days.

(21) Appl. No.: 15/118,872

(22) PCT Filed: Jun. 21, 2016

(86) PCT No.: PCT/CN2016/086636
§ 371 (c)(1),
(2) Date: Aug. 13, 2016

(87) PCT Pub. No.: WO2017/201779
PCT Pub. Date: Nov. 30, 2017

(65) Prior Publication Data
US 2018/0090860 A1    Mar. 29, 2018

(30) Foreign Application Priority Data

May 23, 2016 (CN) .......................... 2016 1 0344135

(51) Int. Cl.
*H05F 3/02* (2006.01)
*H05K 1/02* (2006.01)
(Continued)

(52) U.S. Cl.
CPC ......... *H01R 12/585* (2013.01); *G02F 1/1333* (2013.01); *G02F 1/13452* (2013.01);
(Continued)

(58) Field of Classification Search
CPC .... H01R 12/585; H01R 12/58; H01R 12/523; H01R 23/725; H01R 9/096; H01R 9/091;
(Continued)

(56) References Cited

U.S. PATENT DOCUMENTS 8,187,007 B2 * 5/2012 Emde ................... H01R 12/585
439/751
2009/0325406 A1  12/2009 Kojima

FOREIGN PATENT DOCUMENTS

CN           201146629 Y      11/2008
CN           101777287 A       7/2010
(Continued)

*Primary Examiner* — Gary F Paumen
(74) *Attorney, Agent, or Firm* — Andrew C. Cheng

(57) ABSTRACT

The present disclosure relates to a display device including a backplate made by metallic material, a fixing pillar, a flexible conductive layer, and a PCB. The fixing pillar includes a limiting portion, a fixing portion, and a connecting portion connected in sequence, and the connecting portion connects to the backplate. The flexible conductive layer sheathes a rim of the fixing, and the flexible conductive layer includes a first side and a second side opposite to the first side, and the second side connects to the backplate. The PCB connects between the limiting portion and the first side, and an area of the first side connected by the PCB includes a first ground area for electrically connecting to the backplate via the flexible conductive layer. The PCB of the display device may effectively reduce the electrostatic interference.

9 Claims, 5 Drawing Sheets

(51) Int. Cl.
*H05K 3/00* (2006.01)
*H05K 3/32* (2006.01)
*H05K 7/02* (2006.01)
*H01R 12/57* (2011.01)
*H01R 12/58* (2011.01)
*G02F 1/1333* (2006.01)
*G02F 1/1345* (2006.01)
*G02F 1/1362* (2006.01)

(52) U.S. Cl.
CPC ....... *G02F 1/136204* (2013.01); *H01R 12/57* (2013.01); *H05F 3/02* (2013.01); *H05K 1/0215* (2013.01); *H05K 3/325* (2013.01); *H05K 7/02* (2013.01); *H05K 3/0061* (2013.01); *H05K 2201/1059* (2013.01); *H05K 2201/10242* (2013.01); *H05K 2201/2036* (2013.01)

(58) Field of Classification Search
CPC ...... H01R 13/2414; H01R 12/57; H05K 3/00; H05K 3/32; H05K 3/368; H05K 3/308; H05K 3/325; H05K 3/0061; H05K 7/02; H05K 1/0215; H05K 1/02; H05K 2201/10242; H05K 2201/1059; H05K 2201/2036; H05F 3/02; G02F 1/1333; G02F 1/13452; G02F 1/136204; G02F 1/1345; G02F 1/1362
USPC ................................ 439/74, 75, 82, 751, 91
See application file for complete search history.

(56) References Cited

FOREIGN PATENT DOCUMENTS

| CN | 202794769 | 3/2013 |
| CN | 103823312 A | 5/2014 |
| CN | 204462585 U | 7/2015 |

* cited by examiner

DISPLAY DEVICES

CROSS REFERENCE

This application claims the priority of Chinese Patent Application No. 201610344135.9, entitled "Display devices", filed on May 23, 2016, the disclosure of which is incorporated herein by reference in its entirety.

FIELD OF THE INVENTION

The present invention relates to display device technology field, and more particularly to a display device.

BACKGROUND OF THE INVENTION

Thin Film Transistor Liquid Crystal Displays (TFT-LCDs) have been one of the most popular flat displays, and thus have become the most important display platform of current IT or video products. The main driving principle of the TFT-LCDs is described as below. The system board connects the R/G/B compressed signals, control signals and power with the connector on the printed circuit board (PCB). The data are processed by the timing controller (TCON) IC on the PCB, and connect to the display area of the LCD via source-chip on film (S-COF) and gate-chip on film (G-COF) such that the LCD may obtain the power and the signals.

Conventionally, the PCB is fixed on the back plate via screws. The assembly process is complicated. As the contact capability of the screws is not controllable, and thus the ground attributes of the PCB cannot be guaranteed. When the electrostatic interference is transmitted to the PCB, the electrostatic discharge (ESD) may be bad for the reason that the electrostatic cannot be quickly transmitted to the back plate. To overcome this issue, additional structure has to be configured to increase the grounding property of the PCB, which increases the cost.

SUMMARY OF THE INVENTION

The present disclosure relates to a display device having a printed circuit board (PCB) capable of effectively reduce electrostatic interferences.

In one aspect, a display device includes: a backplate made by metallic material; a fixing pillar comprises a limiting portion, a fixing portion, and a connecting portion connected in sequence, and the connecting portion connects to the backplate; a flexible conductive layer sheathes a rim of the fixing, the flexible conductive layer comprise a first side and a second side opposite to the first side, and the second side connects to the backplate; and a printed circuit board (PCB) connects between the limiting portion and the first side, an area of the first side connected by the PCB comprises a first ground area for electrically connecting to the backplate via the flexible conductive layer.

Wherein a first gap is formed between the limiting portion and the first side, the PCB comprises a first surface and a second surface opposite to the first surface, the first surface connects to the limiting portion, and the second surface connects to the first side, a second gap is formed between the first surface and the second surface, the second gap is greater than the first gap so as to fix the PCB between the limiting portion and the flexible conductive layer.

Wherein a ratio of the second gap to the first gap is greater than or equal to 1.1.

Wherein the fixing pillar is made by metallic material, the area of the limiting portion connected by the PCB comprises a second ground area configured to electrically connect to the backplate via the fixing pillar.

Wherein the PCB comprises a through-hole, an internal surface of the through-hole is covered with a third ground area, the fixing portion passes through the fixing portion, an external surface of the fixing portion is sheathed with the flexible conductive layer, the third ground area connects to the flexible conductive layer to electrically connect to the backplate.

Wherein the third ground area connects to the first ground area and the second ground area.

Wherein the limiting portion is a cone, and the fixing portion is a cylinder, a bottom surface of the limiting portion connects to a top surface of the fixing portion, and a bottom surface of the fixing portion connects to the connecting portion, the PCB is configured with the through-hole, a radius of the bottom surface of the fixing portion is smaller than an internal radius of the through-hole, and the radius of the bottom surface of the limiting portion is greater than the internal radius of the through-hole, the fixing portion passes through the through-hole, and the bottom surface of the limiting portion abuts against the first surface of the PCB such that the second surface abuts against the first side of the flexible conductive layer.

Wherein the through-hole is cross-shaped such that the limiting portion is easily pushed to pass through the through-hole Wherein the connecting portion is configured with external thread, and the backplate is configured with a fixing hole provided with inner thread, the connecting portion engages with the fixing hole via the thread such that the first gap is adjustable.

Wherein the flexible conductive layer is made by conductive foam.

The PCB electrically connects to the backplate via the first ground area and the flexible conductive layer in sequence, and the grounding property of the PCB is reliable. Thus, when the external electrostatic forces contacts with the PCB, the PCB may quickly release the electrostatic charges to the backplate so as to prevent the PCB from the being damaged by the electrostatic forces. That is, the PCB may effectively avoid the electrostatic interference.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
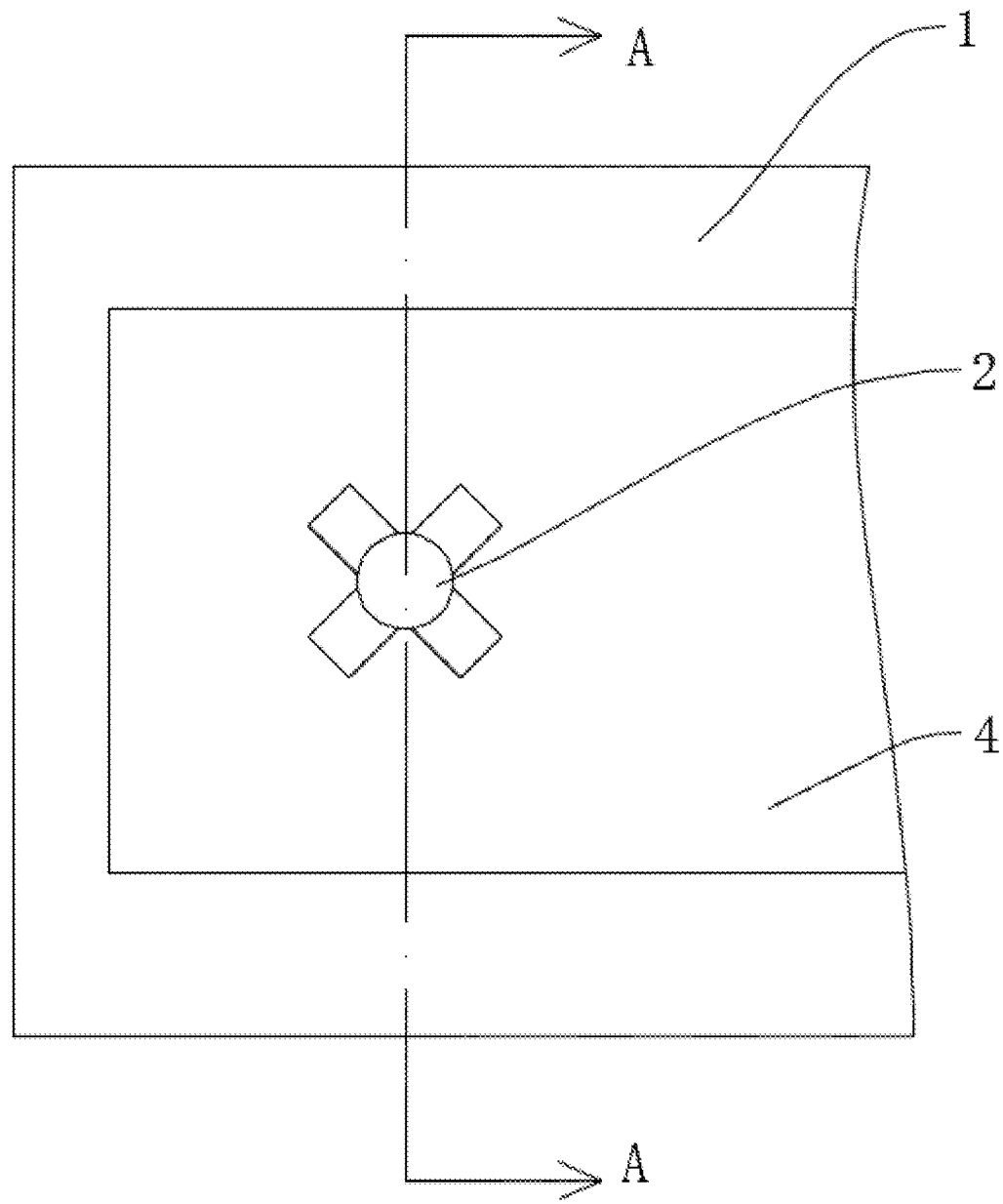
FIG. 1 is a schematic view of the display device in accordance with one embodiment.

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

In the present disclosure, it should be understood that the term "Up", "Down", "front", "rear", "Left", "Right", "inside", "outside", "lateral", etc., is only based on the drawings to illustrate the orientation or positional relationship, but not to indicate or imply device or element referred to must have a particular orientation. Therefore, the present disclosure should not be construed as restrictions.

In the present disclosure, it should be noted that unless otherwise clearly defined and limited, the term "mounted," "connected," "connected" to be broadly understood, for example, can be a fixed connection, a detachable connection, or integrally connected; can be mechanically connected, or may be electrically connected; can be directly connected, or may be connected indirectly through intermediary, the two elements may be internal communication. Those of ordinary skill in the art can understand the above-described circumstances in terms of the present disclosure.

Furthermore, in the present disclosure, unless otherwise indicated, "a plurality of" means two or more. If the term "step" in the present specification appear, which means not only a separate step, while no clear distinction with other processes, this step can be realized as long as the intended function is also included. In this specification, the symbol "~" indicates the numerical range before and after the symbol "~", respectively, as described, including the maximum and minimum values of the range. In the drawings, similar or identical structural units represented by the same reference numerals.

Referring to FIGS. 1-4, a display device includes a backplate 1, a fixing pillar 2, a flexible conductive layer 3, and a PCB 4. The backplate 1 is made by metallic materials. The fixing pillar 2 includes a limiting portion 21, a fixing portion 22, and a connecting portion 23 connected in sequence, and the connecting portion 23 connects to the backplate 1. The flexible conductive layer 3 sheathes a rim of the fixing portion 22. The flexible conductive layer 3 includes a first side 31 and a second side 32 opposite to the first side 31, and the second side 32 connects to the backplate 1. The PCB 4 connects between the limiting portion 21 and the first side 31. An area of the first side 31 connected by the PCB 4 includes a first ground area 41 for electrically connecting to the backplate 1 via the flexible conductive layer 3.

In the embodiment, as the PCB 4 connects to the backplate 1 via the first ground area 41 and the flexible conductive layer 3 in sequence, the grounding property of the PCB 4 is reliable. Thus, when the external electrostatic forces contacts with the PCB 4, the PCB 4 may quickly release the electrostatic charges to the backplate 1 so as to prevent the PCB 4 from the being damaged by the electrostatic forces. That is, the PCB 4 may effectively avoid the electrostatic interference.

At the same time, as the first ground area 41 of the PCB 4 connects to the flexible conductive layer 3 by a surface connection, the contact dimension is large. Thus, the connection therebetween is reliable, which may avoid the poor contact issue.

It can be understood that the first ground area 41 of the PCB 4 may be formed by adopting a bare copper design or other designs only if the first ground area 41 electrically connects to the circuit within the PCB 4. The flexible conductive layer 3 includes a communicating pore arranged in a rim of the fixing portion 22 such that the flexible conductive layer 3 sheathes the rim of the fixing portion 22. In one example, the flexible conductive layer 3 may be a ring-shaped layer. The fixing portion 22 passes through an inner bore of the ring-shaped layer such that the flexible conductive layer 3 sheathes the rim of the fixing portion 22.

Further, referring to FIGS. 1-4, in one embodiment, a first gap (T1) is formed between the limiting portion 21 and the first side 31. The PCB 4 includes a first surface 44 and a second surface 45 opposite to the first surface 44. The first surface 44 connects to the limiting portion 21, and the second surface 45 connects to the first side 31. A second gap (T2) is formed between the first surface 44 and the second surface 45. The second gap (T2) is greater than the first gap (T1) so as to fix the PCB 4 between the limiting portion 21 and the flexible conductive layer 3.

In the embodiment, as the second gap (T2) is greater than the first gap (T1), the PCB 4 may be fixed between the limiting portion 21 and the flexible conductive layer 3 due to the condensability and the recoverability of the flexible conductive layer 3. At this moment, the limiting portion 21 abuts against the first surface 44, and the second surface 45 abuts against the first side 31 such that the flexible conductive layer 3 is deformed. The PCB 4 is subjected to the pressure of the limiting portion 21 and the flexible conductive layer 3, and thus is fixed between the limiting portion 21 and the flexible conductive layer 3. It is to be noted that when the PCB 4 is subjected to the external forces, the flexible conductive layer 3 may further compress the flexible conductive layer 3 so as to slightly move. As such, the PCB 4 is prevented from being damaged during the testing, and thus the display device may display normally. The above-mentioned testing may be bending testing, vibration testing, or other mechanical testing.

Further, in one embodiment, the ratio of the second gap (T2) to the first gap (T1) is greater than or equal to 1.1 to ensure enough compression ratio of the flexible conductive layer 3 so as to enhance the electrical conductivity. Preferably, the ratio of the second gap (T2) to the first gap (T1) is greater than or equal to 1.2. At this moment, even if minor error occurs during the manufacturing process of the PCB 4 and the flexible conductive layer 3, the grounding property of the PCB 4 is also good.

Figure 2:
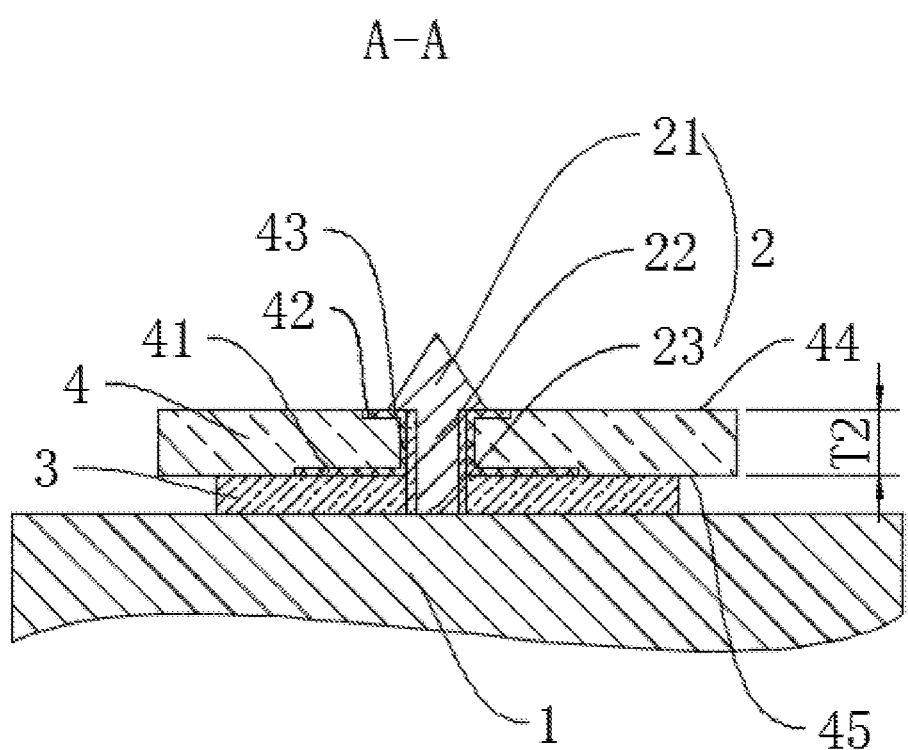
FIG. 2 is a cross sectional view along the A-A line of FIG. 1.
Figure 3:
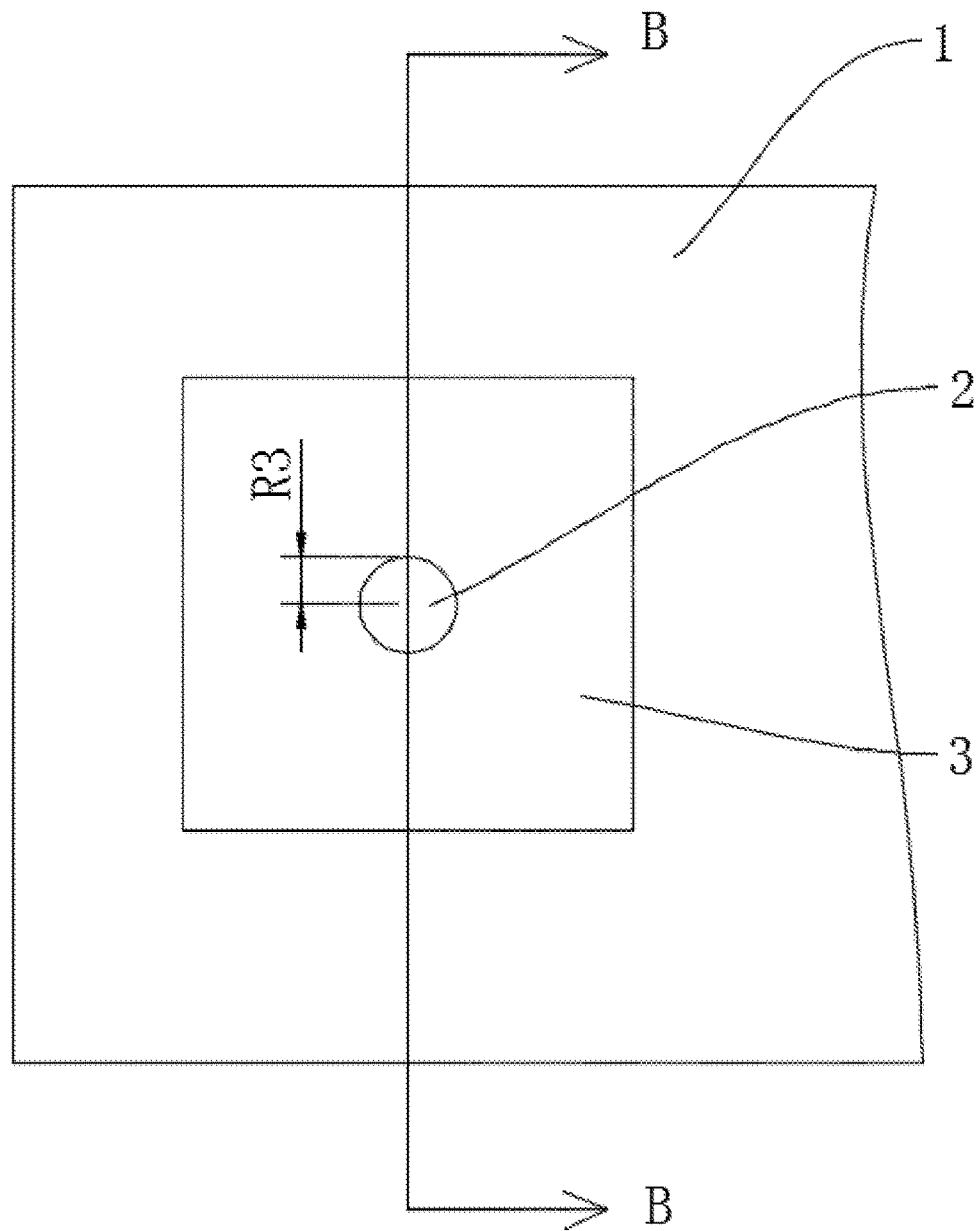
FIG. 3 is a schematic view showing a portion of the display device in accordance with one embodiment.

Further, referring to FIG. 2, in one embodiment, the fixing pillar 2 is made by metallic material. The area of the limiting portion 21 connected by the PCB 4 includes a second ground area 42 configured to electrically connect to the backplate 1 via the fixing pillar 2. In the embodiment, the PCB 4 includes the first ground area 41 (on the second surface 45) and the second ground area 42 (on the first surface 44), and the first ground area 41 and the second ground area 42 electrically connect to the backplate 1. As such, the PCB 4 includes better grounding property. Also, good grounding layers may be formed in the areas of the PCB 4 close to the first surface 44 and the second surface 45, which contributes to the circuit layout of the PCB 4.

Referring to FIGS. 1-5, in one embodiment, the PCB 4 includes a through-hole 46. An internal surface of the through-hole 46 is covered with a third ground area 43. The fixing portion 22 passes through the fixing portion 22, an external surface of the fixing portion 22 is sheathed with the flexible conductive layer 24 so as to electrically connect to the backplate 1. At this moment, the PCB 4 may electrically connect to the backplate 1 via the third ground area 43 such that the antistatic performance of the PCB 4 may be better. In addition, the fixing portion 22 and the through-hole 46 are flexibly connected. It is to be noted that when the PCB 4 is subjected to the external forces, the flexible conductive layer 24 may further compress the flexible conductive layer 3 so as to slightly move. As such, the PCB 4 is prevented from being damaged during the testing, and thus the display device may display normally.

Further, referring to FIG. 2, the third ground area 43 connects to the first ground area 41 and the second ground area 42. At this moment, the internal circuit layout of the PCB 4 may be more flexible to enhance the internal wiring arrangement.

Further, referring to FIGS. 1-5, in one embodiment, the limiting portion 21 is a cone, and the fixing portion 22 is a cylinder. The bottom surface of the limiting portion 21 connects to a top surface of the fixing portion 22, and a bottom surface of the fixing portion 22 connects to the connecting portion 23. The PCB 4 is configured with the through-hole 46. The radius (R1) of the bottom surface of the fixing portion 22 is smaller than an internal radius (R2) of the through-hole 46, and the radius of the bottom surface of the limiting portion 21 (R3) is greater than the internal radius (R2) of the through-hole 46. The fixing portion 22 passes through the through-hole 46, and the bottom surface of the limiting portion 21 abuts against the first surface 44 of the PCB 4 such that the second surface 45 abuts against the first side 31 of the flexible conductive layer 3.

In the embodiment, the limiting portion 21 is a cone, and the PCB 4 may be slightly deformed. After the through-hole 46 aligns with the limiting portion 21, the PCB 4 presses the flexible conductive layer 3 directly, such that the limiting portion 21 is pushed to pass through the through-hole 46. The limiting portion 21 and the flexible conductive layer 3 cooperatively fix the PCB 4. The manufacturing process of the PCB 4 is simple and the manufacturing time may be saved.

Figure 5:
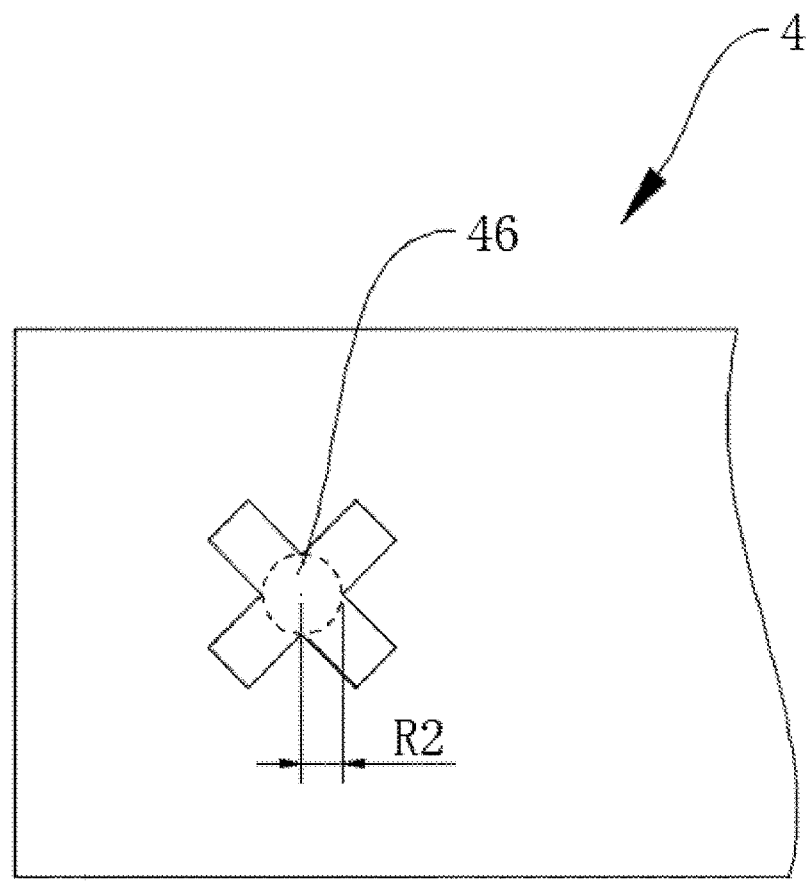
FIG. 5 is a schematic view of the PCB of the display device in accordance with one embodiment.

Further, referring to FIGS. 2 and 5, in one embodiment, the shape of the through-hole 46 is cross-shaped. At this moment, the internal radius (R2) of the through-hole 46 is the internal radius of the circle having the cross-shaped center. As shown in FIG. 5, the elastic deformation stress within the center area of the cross-shaped hole is small such that the limiting portion 21 may be easily pushed to pass through the through-hole 46. In other embodiment, the through-hole 46 may be star-shaped (*). To simply the manufacturing process, the through-hole 46 may be circular or elliptical.

Figure 4:
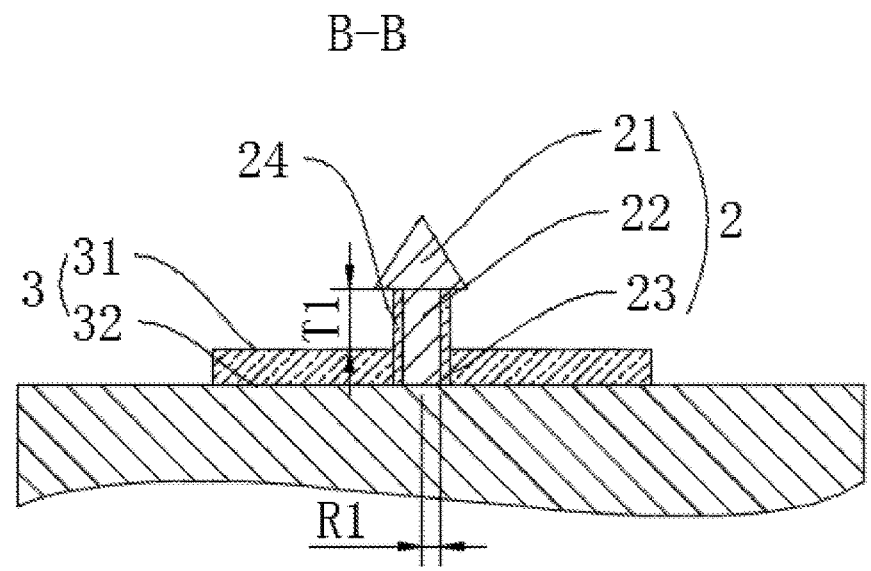
FIG. 4 is a cross sectional view along the B-B line of FIG. 3.
Figure 6:
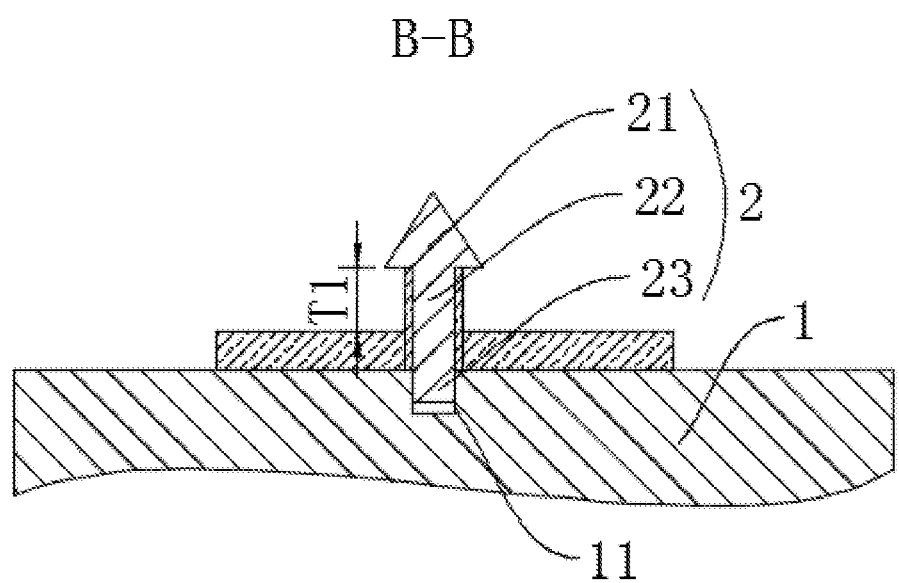
FIG. 6 is another cross sectional view along the B-B line of FIG. 3.

Referring to FIGS. 2, 4, and 6, the connecting portion 23 connects to the backplate 1 in a fixed manner, that is, non-adjustable, for instance, welding (as shown in FIG. 4). In another example, the connecting portion 23 connects to the backplate 1 in a detachable manner. Referring to FIGS. 2 and 6, the connecting portion 23 is configured with external thread, and the backplate 1 is configured with a fixing hole 11 provided with inner thread. The external thread engages with the inner thread such that the connecting portion 23 may connect to the fixing hole 11 by the thread. As such, the first gap (T1) may be adjusted. Thus, due to the adjustable first gap (T1), the display device may incorporate the PCBs 4 of different models, so as come out a variety of designs.

Further, the flexible conductive layer 3 and/or the flexible conductive layer 24 are made by conductive foam, and the condensability and the recoverability of the flexible conductive layer 3 and/or the flexible conductive layer 24 are good. As shown in FIG. 2, the flexible conductive layer 3 may be adhered to the backplate 1 via double-sided conductive tape. The flexible conductive layer 24 may be adhered to the fixing portion 22 via double-sided conductive tape Above are embodiments of the present invention, which does not limit the scope of the present invention. Any modifications, equivalent replacements or improvements within the spirit and principles of the embodiment described above should be covered by the protected scope of the invention.

What is claimed is:

1. A display device, comprising:
a backplate made by metallic material;
a fixing pillar comprises a limiting portion, a fixing portion, and a connecting portion connected in sequence, and the connecting portion connects to the backplate;
a flexible conductive layer sheathes a rim of the fixing portion, the flexible conductive layer comprises a first side and a second side being opposed to the first side, and the second side connects to the backplate; and
a printed circuit board (PCB) connects between the limiting portion and the first side, an area of the first side connected the PCB comprises a first ground area for electrically connecting to the backplate via the flexible conductive layer;
wherein the PCB comprises a first surface and a second surface opposed to the first surface, the PCB is configured with a through-hole, and the limiting portion and the fixing portion passes through the through-hole, and a bottom surface of the limiting portion abuts against the first surface of the PCB such that the second surface abuts against the first side of the flexible conductive layer, an internal surface of the through-hole is covered with a third ground area, the third ground area is connected to the first ground area, an external surface of the fixing portion is sheathed with a flexible conductive element, and the third ground area connects to the flexible conductive layer to electrically connect to the backplate.

2. The display device as claimed in claim 1, wherein a first gap is formed between the limiting portion and the first side, the first surface connects to the limiting portion, and the second surface connects to the first side, a second gap is formed between the first surface and the second surface, the second gap is greater than the first gap so as to fix the PCB between the limiting portion and the flexible conductive layer.

3. The display device as claimed in claim 2, wherein a ratio of the second gap to the first gap is greater than or equal to 1.1.

4. The display device as claimed in claim 1, wherein the fixing pillar is made of metallic material, the area of the limiting portion connected the PCB comprises a second ground area configured to electrically connect to the backplate via the fixing pillar.

5. The display device as claimed in claim 1, wherein the third ground area connects to the second ground area.

6. The display device as claimed in claim 1, wherein the limiting portion is a cone, and the fixing portion is a cylinder, the bottom surface of the limiting portion connects to a top surface of the fixing portion, and a bottom surface of the fixing portion connects to the connecting portion, a radius of the bottom surface of the fixing portion is smaller than an internal radius of the through-hole, and the radius of the bottom surface of the limiting portion is greater than the internal radius of the through-hole.

7. The display device as claimed in claim 6, wherein the through-hole is cross-shaped such that the limiting portion is easily pushed to pass through the through-hole.

8. The display device as claimed in claim 1, wherein the connecting portion is configured with an external thread, and the backplate is configured with a fixing hole provided with inner thread, the connecting portion engages with the fixing hole via the thread such that the first gap is adjustable.

9. The display device as claimed in claim 1, wherein the flexible conductive layer is made by conductive foam.

* * * * *